United States Patent
Baldwin et al.

(10) Patent No.: US 6,402,905 B1
(45) Date of Patent: Jun. 11, 2002

(54) SYSTEM AND METHOD FOR CONTROLLING DEPOSITION THICKNESS USING A MASK WITH A SHADOW THAT VARIES ALONG A RADIUS OF A SUBSTRATE

(75) Inventors: David Alan Baldwin, Annadale; Todd Lanier Hylton, Great Falls, both of VA (US)

(73) Assignee: 4 Wave, Inc, Alexandria, VA (US)

( * ) Notice: Subject to any disclaimer, the term of this patent is extended or adjusted under 35 U.S.C. 154(b) by 0 days.

(21) Appl. No.: 09/811,047

(22) Filed: Mar. 16, 2001

(51) Int. Cl.$^7$ .................. C23C 14/34; C23C 16/00; C23C 8/00; B05C 11/00

(52) U.S. Cl. .................. 204/192.13; 204/298.03; 204/298.11; 118/712; 118/715; 118/504; 118/688; 118/669; 118/665; 427/9; 427/585

(58) Field of Search .................. 204/192.13, 298.03, 204/298.11, 298.28; 427/9, 585; 118/504, 688, 609, 665, 712, 715

(56) References Cited

U.S. PATENT DOCUMENTS

| | | | |
|---|---|---|---|
| 3,904,503 A | 9/1975 | Hanfmann | 204/192 |
| 4,588,942 A | 5/1986 | Kitahara | 324/71.5 |
| 5,707,501 A | 1/1998 | Inoue et al. | 204/298.11 |
| 5,891,311 A | 4/1999 | Lewis et al. | 204/192.12 |
| 6,063,436 A | 5/2000 | Pavell et al. | 427/162 |

Primary Examiner—Steven H. Ver Steeg
(74) Attorney, Agent, or Firm—Morgan, Lewis & Bockius LLP

(57) ABSTRACT

A system and method for controlling a deposition thickness distribution on a substrate includes a motor that rotates the substrate and at least one deposition thickness sensor that senses the deposition thickness on the rotating substrate at two or more radii. At least one actuator varies a shadow of a mask that is disposed over the rotating substrate, wherein the shadow has a surface area that is less than an unmasked surface area of the rotating substrate. A vapor source deposits material on the rotating substrate. A process controller is coupled to the thickness deposition sensor and the at least one actuator. In response to an output of the deposition thickness sensor, the process controller varies the shadow of the mask along a radius of the substrate to control the deposition thickness distribution.

7 Claims, 3 Drawing Sheets

SYSTEM AND METHOD FOR CONTROLLING DEPOSITION THICKNESS USING A MASK WITH A SHADOW THAT VARIES ALONG A RADIUS OF A SUBSTRATE

FIELD OF INVENTION

The present invention is directed generally to novel systems and methods for controlling deposition thickness on substrates, and to optical devices manufactured using such systems and methods.

BACKGROUND OF THE INVENTION

It is believed that in vapor deposition systems such as ion beam sputtering, magnetron sputtering, diode sputtering, thermal evaporation, electron beam evaporation, pulse laser vaporization and cathodic arc vaporization, atoms or molecules ejected from a target material are directed toward a substrate where they condense to form a film. In most cases, the deposited film shows variation in thickness across the wafer that the user would like to eliminate (for uniform deposition) or control (thickness gradient) to meet the needs of a particular application. It would be beneficial to provide a system that improves control of the deposition thickness distribution over a wafer and from wafer-to-wafer during manufacturing runs.

SUMMARY OF THE INVENTION

The present invention is directed to a system and method for controlling a deposition thickness distribution on a substrate. A motor rotates the substrate, and at least one deposition thickness sensor senses the deposition thickness on the rotating substrate at two or more radii on the substrate. At least one actuator varies a shadow of a mask that is disposed over the rotating substrate, and a vapor source deposits material on the rotating substrate. The shadow of the mask on the rotating substrate surface is less than an unmasked surface area on the rotating substrate. A process controller is coupled to the thickness deposition sensor and the at least one actuator. In response to an output of the deposition thickness sensor, the process controller varies the shadow of the mask along a radius of the substrate to control the deposition thickness distribution. The mask "shadows" a portion of the substrate from a vapor flux plume created by the vapor source, thereby modifying the film thickness distribution on the substrate. The invention also includes an optical filter that is created using the disclosed system and method.

BRIEF DESCRIPTION OF THE DRAWINGS

The accompanying drawings, which are incorporated herein and constitute part of this specification, illustrate presently preferred embodiments of the invention, and, together with the general description given above and the detailed description given below, serve to explain features of the invention. In the Drawings.

DETAILED DESCRIPTION OF THE PREFERRED EMBODIMENTS

Figure 1:
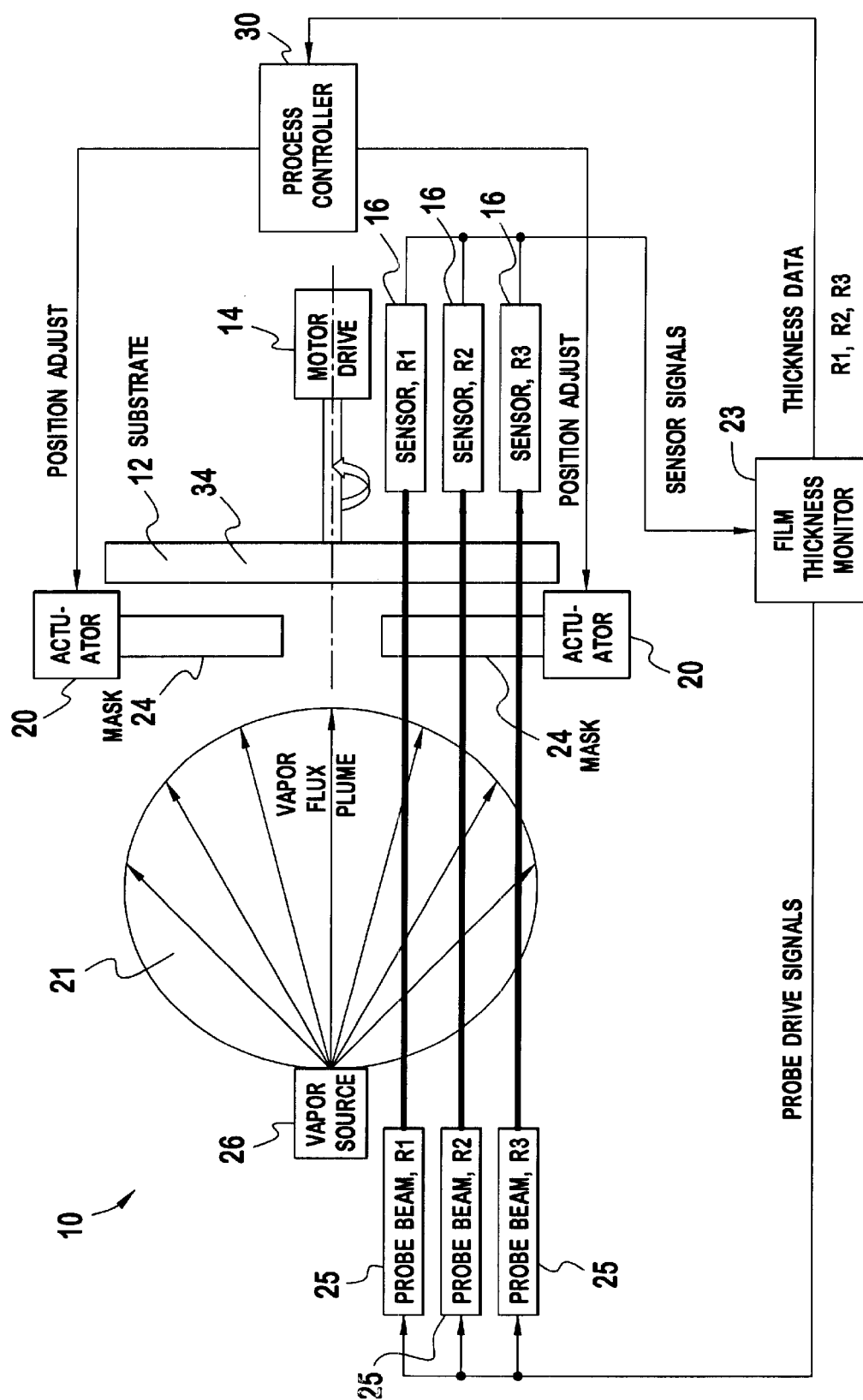
FIG. 1 is a diagram of a system for controlling the deposition thickness distribution on a substrate using a mask with a shadow that varies along a radius of the substrate according to the present invention.
Figure 2:
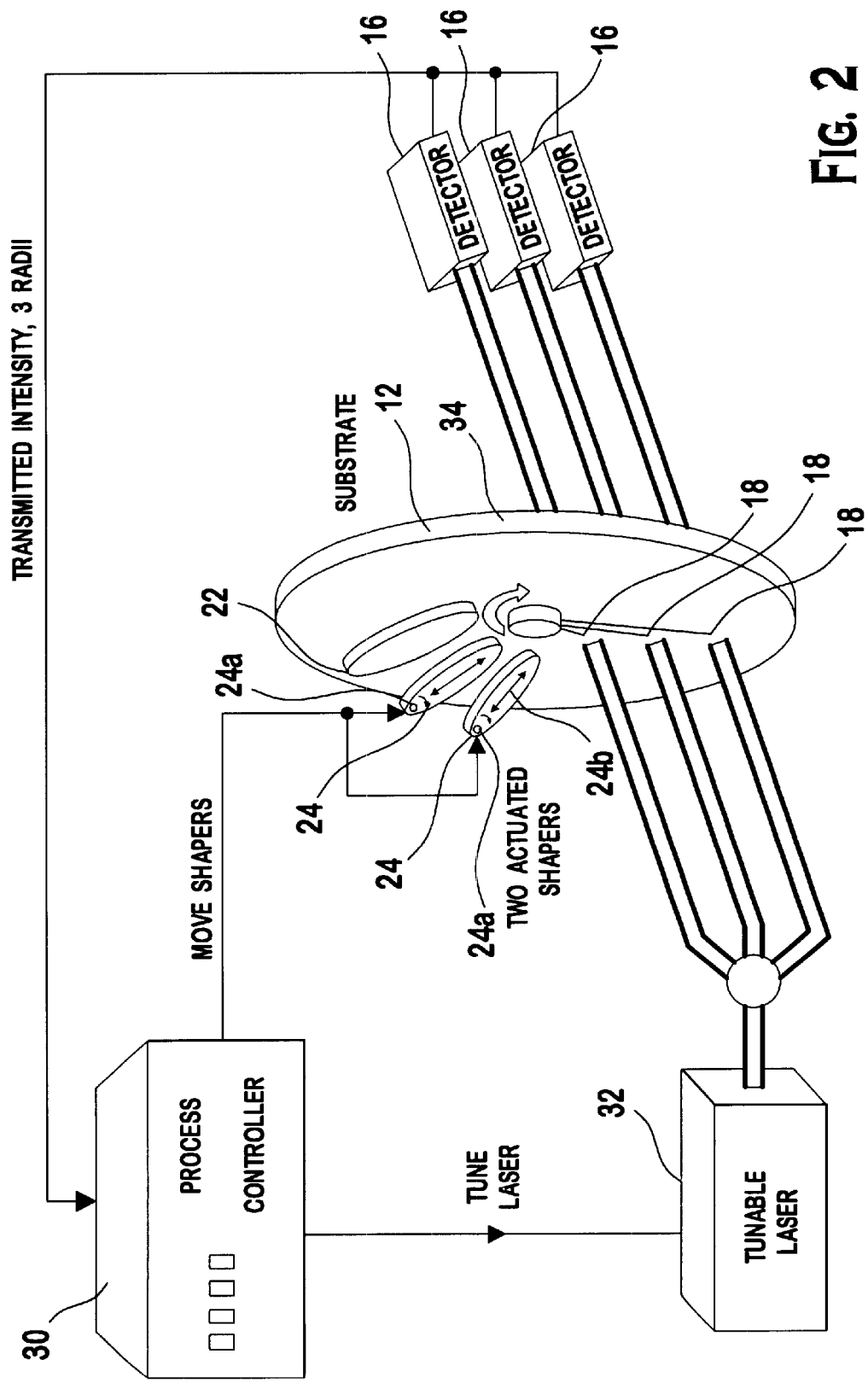
FIG. 2 is an alternate embodiment of the system for controlling the deposition thickness distribution on a substrate using a mask with a shadow that varies along a radius of the substrate according to the present invention.

There is shown in FIG. 1, an embodiment of a control system 10 for controlling the deposition thickness distribution on a substrate 12. The system comprises a motor 14 that rotates the substrate 12 and at least one deposition thickness sensor 16 that senses the deposition thickness of the rotating substrate 12 at two or more radii 18 on the substrate 12. In one embodiment, the axis of rotation of the substrate 12 is substantially normal to the deposition surface of the substrate 12. Referring now to FIG. 1 and FIG. 2, the system further comprises at least one actuator 20 that varies a shadow 22 of a mask 24 that is disposed over the rotating substrate 12. The shadow 22 of mask 24 is less (and, in the embodiment shown, substantially less) than an unmasked surface area on the rotating substrate. In one embodiment, each actuator 20 varies a corresponding shadow 22 by translating a mask 24 along a radius of the rotating substrate. In an alternate embodiment, each actuator 20 varies a corresponding shadow 22 by pivoting a mask 24 about a pivot point 24a that is laterally displaced from the axis of rotation of the substrate. In a further embodiment, each actuator 20 varies a corresponding shadow 22 by "tilting" or rotating a mask 24 about the central axis 24b of the mask 24. It will be understood by those skilled in the art that each shadow 22 could be varied using a combination of the methods described above, or by moving masks 24 in other ways. The vapor source 26 deposits material on the rotating substrate 12. The vapor source 26 creates a vapor flux plume 21 that is disposed proximate the substrate 12. The vapor source 26 may be created by a target that is sputtered by high-energy ions, a target that evaporates as it is heated with high-energy, or a chemical vapor deposition source.

In one embodiment, the deposition thickness sensors 16 sense the deposition thickness at (n) different radii 18 on the rotating substrate 12, and the system includes (n−1) masks 24 each one of which has an independently variable shadow 22, wherein n is an integer that is greater than or equal to two. In the embodiments of FIGS. 1 and 2, n is equal to three. The output of each deposition thickness sensor 16 may be coupled to a film thickness monitor 23, as shown in FIG. 1. A process controller 30 is coupled to the film thickness monitor 23 and each actuator 20. Each actuator 20 is generally a motor drive unit, but those skilled in the art should recognize that other actuators, including solenoids or pneumatic actuators, could be substituted for the motor drives. In response to thickness data (signals R1, R2 and R3) supplied from the film thickness monitor 23, the process controller 30 varies the shadow 22 of the mask 24 along a radius of the substrate 12 to control the deposition thickness distribution over the substrate. By varying the shadows 22, system 10 is able to selectively block the deposition of material from vapor source 26 onto substrate 12, and to thereby adjust the deposition process to compensate for deposition thickness at certain radii on the substrate 12 that might otherwise be greater or lesser than desired as compared to the deposition thickness at other radii on the substrate.

In the embodiment of FIG. 1, the film thickness monitor 23 is coupled to deposition thickness sensor(s) 16 for the purpose of accumulating film thickness data. Film thickness monitor 23 may also be coupled to probe beam(s) 25 in order to set/select probe parameters best suited to the thickness measurement by sensor(s) 16. In another embodiment as shown in FIG. 2, each probe beam 25 may be a tunable laser 32. It should be recognized by those skilled in the art that the process controller 30 and the film thickness monitor 23 may be combined into a single control.

A method for controlling the deposition thickness distribution on a substrate 12 using the system 10 shown in FIG. 1 and FIG. 2, will now be described. The substrate 12 is rotated with the motor 14. The deposition thickness of the substrate 12 is sensed at two or more radii 18 on the rotating substrate 12 with one of the at least one deposition thickness sensor 16. The shadow 22 of at least one mask 24 that is disposed over the rotating substrate is varied with an actuator 20. Material is deposited on the rotating substrate 12 with the vapor source 26. Deposition thickness sensor(s) 16 and the actuator(s) 20 are coupled to the process controller 30. In response to deposition thickness data from at least two radii, the shadow 22 of at least one mask 24 is varied along at least one radius 18 of the rotating substrate 12 in order to control the deposition thickness distribution over the substrate 12 with the process controller 30. The change in the position of the mask(s) selectively shadows the substrate at different radii differently, thereby controlling the deposition thickness distribution. In one embodiment, the position of the mask(s) is varied by process controller 30 so as to maintain a uniform deposition thickness distribution over the surface of the substrate. In an alternate embodiment, the position of the mask(s) is varied by process controller 30 so as to maintain a deposition thickness distribution that varies radially from the rotational axis of the substrate but is substantially constant along any given circumference centered at the axis of rotation of the substrate.

Figure 3A:
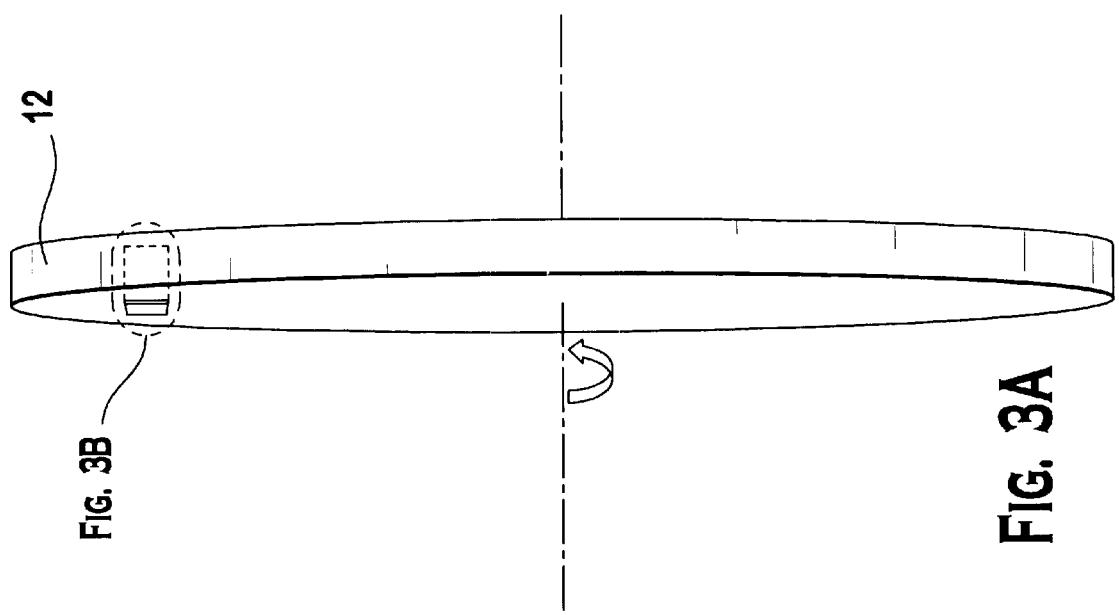
FIG. 3 depicts an optical filter formed using the system and method of the present invention.
Figure 3B:
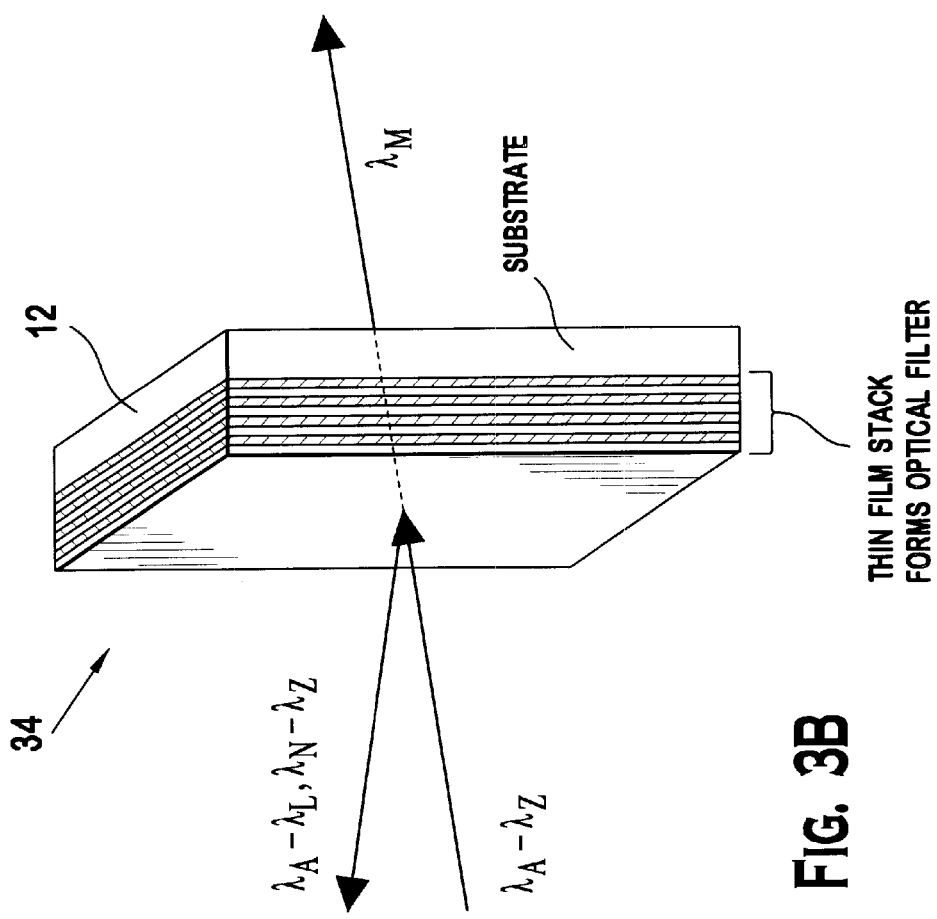

The system and process described above may be advantageously used to create an optical filter 34. As shown in FIG. 3, filter 34 receives wavelengths $\lambda_A-\lambda_Z$, passes $\lambda_M$ and reflects $\lambda_A-\lambda_L, \lambda_N-\lambda_Z$. When the present invention is used to form an optical filter 34, the substrate 12 is preferably formed of a glass wafer, the material deposited on the substrate is alternating layers of tantalum oxide and silicon oxide, and the thickness of the material deposited on the substrate is low-order multiples and/or fractions of the optical thickness at the wavelength of light that the filter will serve to isolate. The filter 34 may be used in the form deposited or it may be further processed by sawing, grinding, trimming, back-thinning, polishing, mounting, bonding or other means to incorporate the filter into an optic assembly. It will be evident to practitioners of the art that substrates other than glass may be used, that smaller substrate pieces may be attached to the wafer 12 for deposition of the filters on the smaller pieces, that deposited materials other than tantalum oxide and-silicon oxide could be used for the filter, as long as the refractive index contrast was sufficiently large, and that a variety of differing optical stack designs might be employed to create a filter.

It will be appreciated by those skilled in the art that changes could be made to the embodiments described above without departing from the broad inventive concept thereof. It is understood, therefore, that this invention is not limited to the particular embodiments disclosed, but is intended to cover modifications within the spirit and scope of the present invention as defined in the appended claims.

What is claimed is:

1. A system for controlling a deposition thickness distribution on a substrate comprising:
    (a) a motor that rotates the substrate;
    (b) at least one deposition thickness sensor that senses the deposition thickness on the rotating substrate at two or more radii on the substrate;
    (c) at least one actuator that varies a shadow of a mask disposed over the rotating substrate, wherein the shadow has a surface area that is less than an unmasked surface area of the rotating substrate;
    (d) a vapor source used to deposit material on the rotating substrate;
    (e) a process controller coupled to the at least one deposition thickness sensor and the at least one actuator; and
    (f) wherein, in response to an output of the at least one deposition thickness sensor, the process controller varies the shadow of the mask along a radius of the rotating substrate to control the deposition thickness distribution.

2. The system of claim 1, wherein the vapor source comprises a vapor source selected from the group consisting of a target sputtered with high energy ions, a target heated with energy, and a chemical vapor deposition source.

3. The system of claim 1, wherein the at least one deposition thickness sensor senses the deposition thickness at (n) different radii on the substrate, and the system includes (n−1) masks disposed over the substrate each one of which has an independently variable shadow; where n is an integer that is greater than or equal to two.

4. The system of claim 3, wherein n is greater than or equal to three.

5. The system of claim 1, further comprising a film thickness monitor, coupled to the process controller, wherein the film thickness monitor provides signals representing the thickness of the substrate at two or more radii on the substrate to the process controller.

6. The system of claim 5, wherein the film thickness monitor is connected to the at least one deposition thickness sensor and at least one probe that generates a probe beam, wherein the probe beam passes through the substrate and is received at the at least one deposition thickness sensor.

7. A method for controlling a deposition thickness distribution on a substrate, the method comprising the steps of:
    (a) rotating the substrate with a motor;
    (b) sensing the deposition thickness on the substrate at two or more radii on the rotating substrate with at least one deposition thickness sensor;
    (c) depositing material on the rotating substrate with a vapor source; and
    (d) varying, in response to an output of the at least one deposition thickness sensor, a shadow of a mask along a radius of the rotating substrate to control the deposition thickness distribution; wherein the shadow has a surface area that is less than an unmasked surface area of the rotating substrate.

* * * * *